(12) United States Patent
Nakahara

(10) Patent No.: US 8,031,450 B2
(45) Date of Patent: Oct. 4, 2011

(54) POWER SUPPLY CONTROL CIRCUIT

(75) Inventor: Akihiro Nakahara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 326 days.

(21) Appl. No.: 12/329,063

(22) Filed: Dec. 5, 2008

(65) Prior Publication Data

US 2009/0147422 A1    Jun. 11, 2009

(30) Foreign Application Priority Data

Dec. 11, 2007   (JP) .................................. 2007-319450

(51) Int. Cl.
*H02H 3/20* (2006.01)
(52) U.S. Cl. ........................ 361/91.1; 361/84; 307/127
(58) Field of Classification Search .................. 361/84, 361/88, 82, 91.1, 100, 101; 307/127
See application file for complete search history.

(56) References Cited

U.S. PATENT DOCUMENTS

| | | | |
|---|---|---|---|
| 4,992,683 A | 2/1991 | Robin, Jr. | |
| 5,517,379 A | 5/1996 | Williams et al. | |
| 5,764,465 A | 6/1998 | Mattes et al. | |
| 6,288,881 B1 * | 9/2001 | Melvin et al. | 361/18 |
| 6,882,513 B2 * | 4/2005 | Laraia | 361/91.1 |
| 7,283,343 B2 * | 10/2007 | Grose et al. | 361/84 |
| 7,382,594 B2 * | 6/2008 | Migliavacca | 361/90 |
| 2007/0014064 A1 | 1/2007 | Souma | |

FOREIGN PATENT DOCUMENTS

| | | |
|---|---|---|
| EP | 1 860 774 | 11/2007 |
| JP | 2007-19812 | 1/2007 |
| JP | 2007-28747 | 2/2007 |

OTHER PUBLICATIONS

European Patent Office issued a European Search Report dated Apr. 16, 2009, Application No. 08021472.9.

* cited by examiner

*Primary Examiner* — Patrick Salce
(74) *Attorney, Agent, or Firm* — Young & Thompson

(57) ABSTRACT

A power supply control circuit includes a control circuit that controls an output transistor to be rendered conductive by forming a second electrical path between a second power supply line and a control terminal of the output transistor when a power supply voltage is applied in a reverse direction between first and second power supply lines, and that controls a second electrical path to be electrically disconnected when the power supply voltage is applied in a forward direction between the first and second power supply lines.

22 Claims, 4 Drawing Sheets

POWER SUPPLY CONTROL CIRCUIT

BACKGROUND

1. Field of the Invention

The present invention relates to a power supply control circuit. In particular, the present invention relates to a power supply control circuit having a function of protecting an output transistor that controls power supply to a load, against overvoltage which may be superimposed on a power supply line (herein after, referred to as "overvoltage protection function"), and also having a function of protecting the output transistor against reverse connection of a power supply (hereinafter, referred to as "power supply reverse connection protection function").

2. Description of Related Art

Japanese Unexamined Patent Application Publication No. 2007-028747 (hereinafter, referred to as "Patent Document 1"), for example, discloses a power supply control circuit having an overvoltage protection function. The structure of the power supply control circuit is described with reference to FIG. 1. A power supply control circuit 100 includes a gate charge discharging circuit 108, a gate resistor 107, an output MOS transistor 109, a switch 110, a dynamic clamp circuit 111, and a load 112.

The switch 110 and the clamping diode 111 are connected in series with each other between a gate of the output transistor 109 and a power supply line 101 (connected to a positive terminal of a battery power supply or the like). Further, a ground potential (electrically connected to a negative terminal of the battery power supply) 130 is applied to a gate of the switch 110 as a reference voltage. Thus, the overvoltage protection function is realized. Operations thereof are described in detail in Patent Document 1, so a description thereof is herein omitted.

Meanwhile, Japanese Unexamined Patent Application Publication No. 2007-019812 (hereinafter, referred to as "Patent Document 2"), for example, discloses a power supply control circuit having a power supply reverse connection protection function. The structure of the power supply control circuit is described with reference to FIG. 2. Note that components identical with those shown in FIG. 1 are denoted by the same reference numerals. A transistor 114 serving as a control Nch switch is connected between a power supply line (electrically connected to a negative terminal of a battery power supply) 103, which is an illustrative example of a third power supply, and an output transistor 109. As disclosed in Patent Document 2, an electric charge is applied to the output transistor 109 through a parasitic diode 115 of the transistor 114 when a power supply is reversely connected, with the result that the output transistor 109 is rendered conductive and protected. The transistor 114 functions as a power supply reverse connection protection circuit.

Note that a power supply line 102 connected to one end of the load 112 as shown in FIGS. 1 and 2 and serving as a second power supply is connected to the negative terminal of the battery power supply.

While the circuit of FIG. 1 having the overvoltage protection function and the circuit of FIG. 2 having the power supply reverse connection protection function have been proposed as described above, the present inventor has thought that a power supply control circuit having both the functions has not been realized yet. To realize the power supply control circuit having both the functions, the control switch transistor 114 may be provided, as shown in FIG. 2, between the gate of the transistor 109 shown in FIG. 1 and the power supply line connected to the negative terminal of the battery power supply. This structure has a problem in that, in the case where the load 112 generates a counter electromotive voltage upon non-conduction of the output transistor 109, the switch 110 is not rendered conductive and a predetermined clamp voltage is not applied to the output transistor 109.

The transistor 110 for implementing the overvoltage protection function needs to be rendered conductive based on a counter electromotive force generated by the load 112, when the state of the output transistor 109 changes to a non-conductive state. A mechanism thereof is as follows. A change in voltage to a negative voltage due to the counter electromotive force generated from a load of an output terminal 106 is transmitted to the gate of the output transistor 109 through the transistor 108 and the gate resistor 107, thereby rendering the transistor 110 conductive. When a gate potential of the output transistor 109 is lowered, however, the parasitic diode 115 of the transistor 114, which is provided to implement the power supply reverse connection protection function, is rendered conductive, and the decrease in gate potential of the output transistor 109 is suppressed. As a result, the transistor 110 is inhibited from being rendered conductive.

SUMMARY

The inventor has found a problem the output transistor is not rendered conductive as explained above.

A first exemplary aspect of an embodiment of the present invention is a power supply control circuit, including: first and second power supply lines, a power supply voltage being applied between the first and second power supply lines; an output transistor provided between the first power supply line and an output terminal; a first switch transistor rendered conductive when a counter electromotive voltage is applied to the output terminal from a load coupled to the output terminal, to form a first electrical path between the first power supply line and a control terminal of the output transistor; and a control circuit that controls the output transistor to be rendered conductive by forming a second electrical path between the second power supply line and the control terminal of the output transistor when the power supply voltage is applied in a reverse direction between the first and second power supply lines, and that controls the second electrical path to be electrically disconnected when the power supply voltage is applied in a forward direction between the first and second power supply lines.

According to the present invention, when the power supply voltage is reversely connected, the second electrical path to the control terminal of the output transistor is formed, whereby the output transistor is rendered conductive. When the power supply is normally connected (when the power supply is connected in the forward direction), the second electrical path is disconnected. Accordingly, the first switch transistor is rendered conductive with respect to the counter electromotive voltage of the load, without affecting the desired operation, thereby protecting the output transistor.

Hence, the output transistor is protected during both the normal connection and the reverse connection of the power supply.

A second exemplary aspect of an embodiment of the present invention is a power supply control circuit, including: an output transistor coupled between a first power supply line and an output terminal; a load coupled between the output terminal and a third power supply line; a gate charge discharging switch coupled between a control terminal of the output transistor and the output terminal; an overvoltage protection circuit comprising: a dynamic clamp circuit that limits a voltage difference between the first power supply line and the output terminal to a predetermined voltage value; and a first switch coupled between the dynamic clamp circuit and the control terminal of the output transistor, and to be conductive or non-conductive state based on a result of comparison between a reference voltage and a voltage at the output terminal; a power supply reverse connection protection circuit that supplies an electric charge to the control terminal of the output transistor when a power supply is reversely connected; a second switch with one end coupled to the output terminal, and another end coupled to a second power supply line through a resistor; and a control circuit that applies a potential corresponding to a potential of one of the first power supply line and the second power supply line to a control terminal of the second switch according to a connection state of the power supply, and that applies a potential corresponding to a potential of one of the output terminal and the second power supply line, to a substrate terminal of the second switch according to the connection state of the power supply and a state of the output terminal.

A third exemplary aspect of an embodiment of the present invention is a power supply control circuit, including: first and second power supply lines, a power supply voltage being applied between the first and second power supply lines; an output transistor connected between the first power supply line and an output terminal; a first switch provided between the first power supply line and a control terminal of the output transistor, and rendered conductive when a counter electromotive voltage is applied to the output terminal from a load connected to the output terminal; and a control circuit that controls the output transistor to be rendered conductive by electrically connecting the control terminal of the output transistor and the second power supply line, or causes the control terminal of the output transistor and the second power supply line to be electrically disconnected from each other, according to a state of the power supply voltage applied between the first power supply line and the second power supply line.

BRIEF DESCRIPTION OF THE DRAWINGS

The above and other objects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
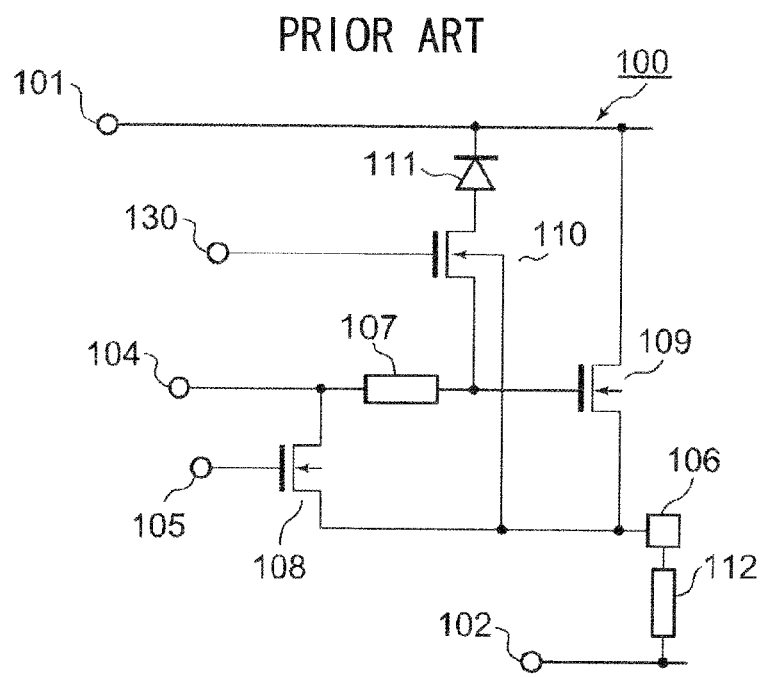
FIG. 1 is a conventional circuit diagram showing a first related art example.
Figure 2:
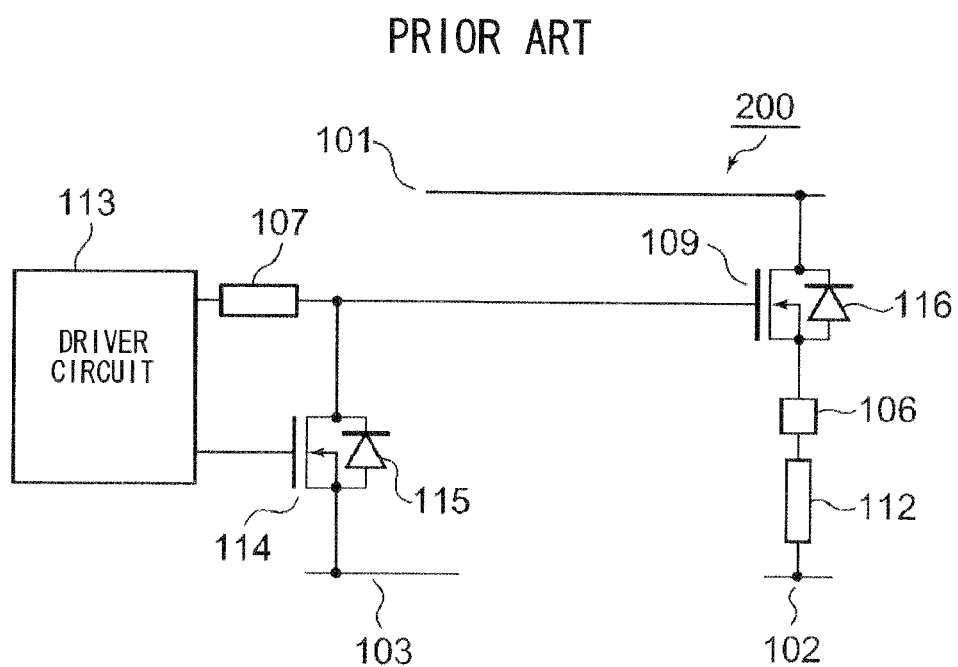
FIG. 2 is a conventional circuit diagram showing a second related art example.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, specific embodiments to which the present invention is applied will be described in detail with reference to the drawings. The same components are denoted by the same reference numerals throughout the drawings, and a redundant description thereof is omitted as appropriate for clarification of the explanation.

Exemplary embodiments of the present invention will be described hereinafter in detail with reference to the accompanying drawings.

Figure 3:
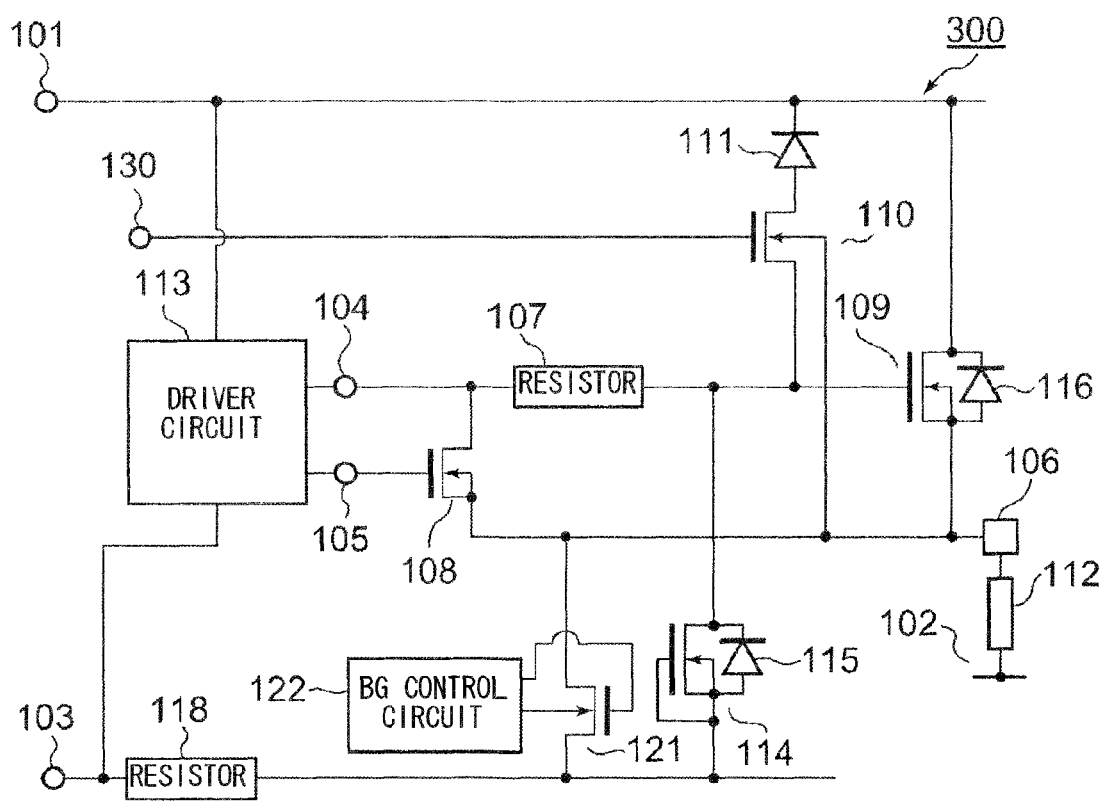
FIG. 3 is a circuit diagram showing a power supply control circuit according to a first exemplary embodiment of the present invention.

FIG. 3 shows a power supply control circuit 300 according to a first exemplary embodiment of the present invention. The power supply control circuit 300 includes a gate charge discharging transistor (gate charge discharging switch) 108, a gate resistor 107, an output transistor 109, a switch transistor (first switch) 110, a dynamic clamp circuit 111, a driver circuit 113, a switch transistor (switching element) 114, a resistor 118, a switch transistor (second switch) 121, a back gate (BG) control circuit (gate voltage control circuit) 122, and a load 112. Note that the gate resistor 107 may be omitted. The switch transistor 114 functions as a power supply reverse connection protection switch (power supply reverse connection protection circuit). The gate charge discharging transistor (gate charge discharging circuit) 108 is also referred to simply as "transistor 108". As will be apparent from the following description, the switch transistor 110 and the dynamic clamp circuit 111 form an overvoltage protection circuit.

The output transistor 109 is a so-called high-side N-channel MOS transistor. A first terminal (for example, drain) of the output transistor 109 is coupled to a first power supply line (for example, positive terminal of battery power supply) 101. A second terminal (for example, source) of the output transistor 109 is coupled to a third power supply line (for example, negative terminal of battery power supply being set at ground potential) 102 through the load 112. A node between the output transistor 109 and the load 112 serves as an output terminal 106. A control terminal (for example, gate) of the output transistor 109 is coupled to one end of the gate resistor 107. The other end of the gate resistor 107 receives a first control signal 104 from the driver circuit 113. The gate charge discharging transistor 108 is coupled between the other end of the gate resistor 107 and the output terminal 106.

According to an exemplary embodiment of the present invention, the gate charge discharging transistor 108 is formed of an N-channel MOS transistor. A drain of the transistor 108 is coupled to the other end of the gate resistor 107, and a source of the transistor 108 is coupled to the output terminal 106. A gate of the transistor 108 is supplied with a second control signal 105 from the driver circuit 113.

The control terminal (gate) of the output transistor 109 is coupled to a drain of the switch transistor 114 serving as the power supply reverse connection protection switch. The switch transistor 114 is an N-channel MOS transistor. A source of the switch transistor 114 is coupled to a second power supply line 103 (electrically connected to the negative terminal of a battery power supply) through the resistor 118. A gate of the switch transistor 114 is coupled to the source thereof. Incidentally, the power supply line 102 and the power supply line 103 are frequently connected to different nodes in a total system apart from each other. Thereby voltage difference of about 2V may occur between the power supply line 102 and the power supply line 103.

The output transistor 109 includes a parasitic diode 116 having an anode coupled to the output terminal 106, and a cathode coupled to the first power supply 101. The switch transistor 114 includes a parasitic diode 115 having an anode coupled to one end of the first resistor 118, and a cathode coupled to the control terminal of the output transistor 109. The driver circuit 113 is coupled between the power supply lines 101 and 103, and operates with a voltage between the lines 101 and 103 as a power supply.

To realize an overvoltage protection function, the switch transistor 110 and the dynamic clamp circuit 111 are coupled in series with each other between the gate of the output transistor 109 and the power supply line 101. According to an exemplary embodiment of the present invention, the switch transistor 110 is formed of an N-channel MOS transistor, and the dynamic clamp circuit 111 is formed of a single Zener diode.

The switch transistor 110 has a source coupled to the gate of the output transistor 109, a drain coupled to an anode of the dynamic clamp circuit 111, a control terminal (for example, gate) coupled to a reference voltage node 130, and a substrate terminal (back gate) coupled to the output terminal 106. A cathode of the dynamic clamp circuit 111 is coupled to the power supply line 101. When the power supply voltage is normally applied, a potential substantially equal to a ground potential (potential of power supply line 103) appears at the reference voltage node 130.

The switch transistor 110 compares a potential at the reference voltage node 130 with a gate voltage of the output MOS transistor 109. When a difference between two potentials is equal to or larger than a threshold of the MOS transistor serving as the switch transistor 110, the switch transistor 110 is rendered conductive.

The dynamic clamp circuit 111 is a circuit that limits a voltage difference between the anode and the cathode to a predetermined voltage value (for example, dynamic clamp voltage) or smaller when the voltage difference between the anode and the cathode is equal to or larger than a breakdown voltage of the diode. The load 112 is an inductive load having an inductance component, such as a solenoid, or an inductance component of a wire harness connected to the output terminal.

Further, in the power supply control circuit 300, the switch transistor 121 is coupled between the output terminal 106 and the resistor 118. According to an exemplary embodiment of the present invention, the switch transistor 121 is formed of an N-channel MOS transistor. One of a drain and a source of the switch transistor 121 is coupled to the output terminal 106, and the other of the drain and the source is coupled to one end of the resistor 118. In terms of circuit operation, the drain of the switch transistor 121 may act as the source and the source thereof as the drain. Further, a control terminal (gate (also referred to as "front gate")) and a substrate terminal (back gate) of the switch transistor 121 are supplied with a respective gate voltage, which is described later, from the BG control circuit 122.

Figure 4:
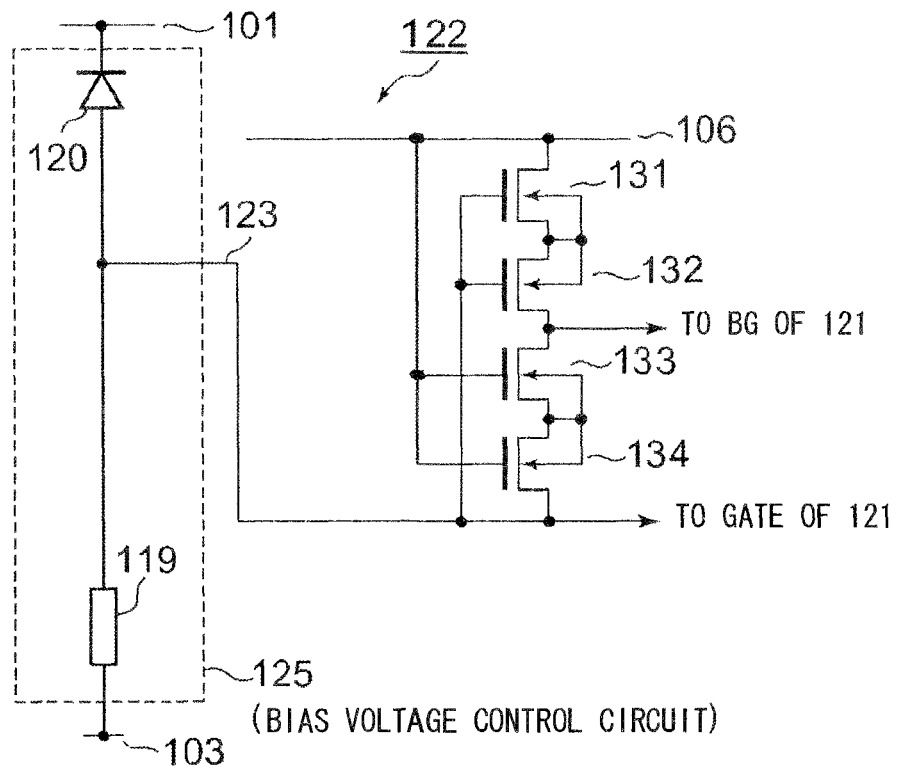
FIG. 4 is a circuit diagram showing an example of a gate voltage control circuit shown in FIG. 3.

Referring to FIG. 4, the BG control circuit 122 includes a bias voltage control circuit 125 including a diode 120 and a resistor 119 which are coupled in series with each other between the power supply lines 101 and 103. A potential at a bias output node 123 of the bias voltage control circuit 125 is supplied to the gate of the switch transistor 121. As a result, the diode 120 is rendered non-conductive when the power supply is normally connected, so a potential substantially equal to a potential of the power supply line 103 is applied to the gate of the switch transistor 121. On the other hand, the diode 120 is biased in the forward direction when the power supply is reversely connected, so a potential substantially equal to a potential of the power supply line 101 is applied to the gate of the switch transistor 121.

The BG control circuit 122 further includes four N-channel MOS transistors 131, 132, 133, and 134 which are connected in series with each other between the output terminal 106 and the bias output node 123 of the bias voltage control circuit 125. The transistor 131 has a drain connected to the output terminal 106 and a source connected to a source of the transistor 132. A drain of the transistor 132 is connected to the substrate terminal (back gate) of the switch transistor 121 and to a drain of the transistor 133. Control terminals of the transistors 131 and 132 are each connected to the bias output node 123, and substrate terminals thereof are each connected to the source of the transistor 131. A source of the transistor 133 is connected to a source of the transistor 134, and a drain of the transistor 134 is connected to the bias output node 123. Control terminals of the transistors 133 and 134 are each connected to the output terminal 106, and substrate terminals thereof are each connected to the source of the transistor 133.

Note that the structure and operations of the drive circuit 113 shown in FIG. 3 are well known to those skilled in the art, so a description thereof is omitted.

Next, operations of the power supply control circuit 300 are described in detail. In this case, the operations are classified into two types, that is, an operation performed when the power supply is normally connected, and an operation performed when the power supply is reversely connected. Further, the operation performed when the power supply is normally connected includes the following modes. That is, a conductive mode, a negative voltage surge mode, and a dump surge mode. In the conductive mode, the output transistor 109 is rendered conductive, and power is supplied to the load 112 through the output terminal 106. In the negative voltage surge mode, a negative voltage surge occurs to the output terminal 106 from the load 112 as a counter electromotive voltage, when the output transistor 109 is rendered non-conductive. In the dump surge mode, a positive voltage surge (dump surge) occurs in the battery power supply line 101 by a battery terminal being disconnected while generating electricity for an alternator. The operations of the power supply control circuit 300 are described in each of the three modes.

First, in the conductive mode, when the first control signal 104 becomes a high level, the output transistor 109 is rendered conductive. The high-level first control signal 104 renders the output transistor 109 conductive with a low channel resistance. Thus, the high level signal of the first control signal 104 is, for example, a voltage obtained by boosting the battery power supply (voltage between power supply lines 101 and 103). Accordingly, power is supplied to the load 112 through the output terminal 106. In this case, the second control signal 105 having a phase opposite to that of the first control signal 104 is set at low level (for example, ground potential). As a result, the transistor (gate charge discharging circuit) 108 is rendered non-conductive.

In the state where the power supply is normally connected, the reference voltage node 130 is set at the ground potential (low level). The gate voltage of the output transistor 109 is set at high level (bootstrap potential higher than a potential level of the power supply line 101). Thus, the switch transistor (first switch) 110 is rendered non-conductive, and the dynamic clamp circuit 111 remains deactivated.

In the BG control circuit 122 (see FIG. 4), the potential at the bias output node 123 is substantially equal to the ground potential of the power supply line 103, and a potential at the output terminal 106 is high. A source potential of each of the transistors 131 and 132 is about 0.7 V higher than the potential at the output terminal 106 through a parasitic diode (not shown) provided between the substrate terminal and the drain terminal of the transistor 131.

Since a potential at each of the control terminals of the transistors 131 and 132 is substantially equal to the ground potential, the transistors 131 and 132 are non-conductive. A source potential of each of the transistors 133 and 134 is about 0.7 V higher than the potential at the bias output node 123 through a parasitic diode (not shown) provided between the substrate terminal and the drain terminal of the transistor 134. Since a potential at each of the control terminals of the transistors 133 and 134 is equal to the potential at the output terminal 106, the transistors 133 and 134 are rendered conductive.

In the BG control circuit 122, both the control terminal and the substrate terminal of the switch transistor 121 shown in FIG. 3 are set to be substantially equal to the ground potential, and the switch transistor 121 is rendered non-conductive. In this case, the switch transistor 114 is in a reversely biased state, and thus the switch transistor 114 is in the non-conductive state.

Next, the operation under the negative voltage surge is described. The negative voltage surge occurs on turn-off, when the output transistor 109 is rendered non-conductive. In this case, the first control signal 104 is set at low level (ground potential), and the second control signal 105 is set at high level (at least a potential level of power supply line 101). Note that the second control signal 105 may be set at the bootstrap potential obtained by boosting the potential of the line 101, depending on the circuit type.

Since the second control signal 105 is set at high level, the transistor 108 is rendered conductive. A gate charge of the output transistor 109 is discharged through the gate resistor 107 and the gate charge discharging transistor 108. As a result, the output transistor 109 is rendered non-conductive. In response to the non-conduction of the output transistor 109, an inductor component of the load 112 causes the negative voltage surge.

Figure 5:
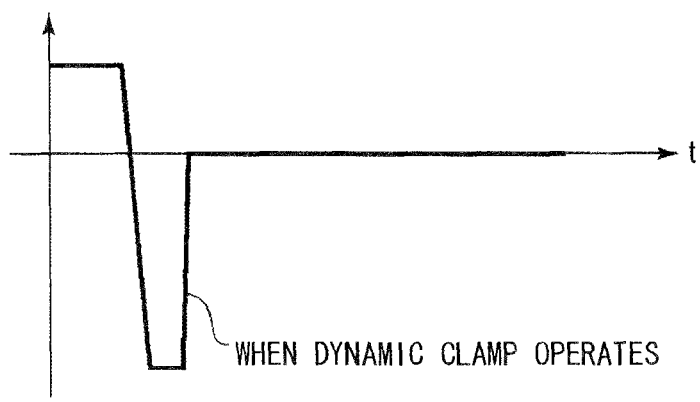
FIG. 5 is a waveform chart showing a voltage at an output terminal of FIG. 3 at the time of normal power supply voltage connection.

When the negative voltage surge is generated, a voltage at the output terminal 106 drops as shown in FIG. 5. Further, since the transistor 108 is conductive, the gate voltage of the output transistor 109 drops as the voltage at the output terminal 106 drops.

When the voltage at the output terminal 106 shifts to a negative voltage, the potential (ground potential) at the second power supply line 103 becomes higher than the potential at the output terminal 106. Then, the transistors 131 and 132 of the BG control circuit 122 (FIG. 4) are rendered conductive, and the transistors 133 and 134 are rendered non-conductive. Thus, the BG control circuit 122 sets a potential at the substrate terminal of the switch transistor 121 (see FIG. 3) to be equal to the potential at the output terminal 106. The substrate terminal of the switch transistor 121 remains substantially equal to the ground potential. In this manner, a source voltage (potential of a node coupled to the output terminal 106 side) of the switch transistor 121 becomes lower than a gate voltage thereof, and thus the switch transistor 121 is rendered conductive.

Upon conduction of the switch transistor 121, a potential at a node between the source and the gate of the switch transistor 114 is substantially equal to the potential at the output terminal 106. On the other hand, a potential on the drain side of the switch transistor 114 is equal to or higher than the potential at the output terminal 106. Thus, the switch transistor 114 remains non-conductive. Further, the parasitic diode 115 is in a reversely-biased state. As described above, the non-conductivity of the switch transistor 114 is reliably secured in the negative voltage surge mode.

When a potential difference between the voltage at the reference voltage node 130 (that is, ground potential), which is equal to a gate voltage of the switch transistor 110, and the gate voltage of the output transistor 109 exceeds the threshold of the switch transistor 110 as the voltage at the output terminal 106 drops, the switch transistor 110 is rendered conductive. After that, when the gate voltage of the output transistor 109 drops due to the voltage drop of the output terminal 106 (see FIG. 5), a potential difference between both terminals of the dynamic clamp circuit 111 becomes equal to or larger than the breakdown voltage of the dynamic clamp circuit 111, and a dynamic clamp voltage is generated at both terminals of the dynamic clamp circuit 111. As a result, the output transistor 109 is rendered conductive. A voltage between the drain and the gate of the output transistor 109 is limited by the dynamic clamp voltage. The voltage between the drain and the source of the output transistor 109 is limited by a value of a voltage obtained by adding the dynamic clamp voltage and a threshold voltage of the output transistor 109.

Also in this operation period, voltages between both terminals of the switch transistor 114 and the parasitic diode 115 do not exceed threshold voltages of the switch transistor 114 and the parasitic diode 115, respectively, due to the presence of the switch transistor 121 that is rendered conductive. Thus, the switch transistor 114 and the parasitic diode 115 remain non-conductive.

Note that the counter electromotive force generated by the load 112 is then absorbed by the load 112 itself, and the potential at the output terminal 106 converges on a zero potential (ground potential) as shown in FIG. 5.

Next, the operation under the dump surge mode is described. When a dump surge is applied to the power supply line 101, the potential thereof increases. In this case, the gate voltage of the switch transistor 110 is substantially equal to the ground potential. The voltage at each of the gate of the output transistor 109 and the output terminal 106 is equal to or higher than the ground voltage. As a result, the switch transistor 110 is rendered non-conductive. The gate of the output transistor 109 and the battery power supply line 101 are electrically disconnected from each other. Thus, the gate of the output transistor 109 is free from the influence of a fluctuation in voltage of the battery power supply 101, and the output transistor 109 is rendered non-conductive.

The dump surge voltage is applied between the source and the drain of the output transistor 109 that is rendered non-conductive. In this case, a withstand voltage between the drain and the gate of the output transistor 109, and a withstand voltage between the drain and the source thereof are generally set to be higher than the dump surge voltage. Accordingly, the output transistor 109 is prevented from being destroyed due to the dump surge.

Since the output transistor 109 is non-conductive, the potential of the gate of the switch transistor 121 is equal to that of the source of the switch transistor 121, and the switch transistor 121 is rendered non-conductive. The switch transistor 114 is rendered non-conductive because a forward bias is not applied between the gate and the source of the switch transistor 114, for example.

As described above, in both the negative voltage surge mode and the dump mode, the switch transistor 114 and the parasitic diode 115 remain non-conductive, thereby realizing desired operations in those modes.

Next, a description is given of the operation performed when the power supply is reversely connected. Consideration is given to the case where the polarity of a battery power supply VB is reversely connected due to an error caused by an operator. Specifically, consideration is given to the case where the positive terminal of the battery power supply is electrically connected to each of the power supply lines 102 and 103 and the negative terminal of the battery power supply is electrically connected to the power supply line 101. In this case, assuming that the power supply line 102 and the power supply line 103 are set at the ground potential, the first power supply line 101 is set at a −VB potential.

In this situation, though the gate and the source of the switch transistor 114 are connected in common, the parasitic diode 115 is rendered conductive, thereby forming an electrical path between the power supply line 103 and the gate of the output transistor 109.

A potential of −VB+0.7 V is applied to the gate of the switch transistor 121 from the BG control circuit 122 (FIG. 4). The source of the switch transistor 121 is set at a potential substantially equal to the ground potential. Accordingly, the switch transistor 121 is rendered non-conductive, and does not affect the operation of each of the switch transistor 114 and the parasitic diode 115.

In this manner, when the power supply is reversely connected, the output transistor 109 is rendered conductive, and a current flows in a direction opposite to that at the time of a normal connection, that is, flows from the source to the drain of the output transistor 109. The magnitude of the current is substantially the same as that of a load current obtained during normal operation, and an on-resistance of the output transistor 109 is substantially equal to that obtained at the time of normal operation. Accordingly, a calorific value of the output transistor 109 is equal to that obtained during the normal operation (when battery power supply VB is normally connected).

Hence, even when the battery power supply VB is reversely connected, the output transistor 109 is prevented from being destroyed due to application of heat As described above, the power supply control circuit 300 according to an exemplary embodiment of the present invention is capable of protecting the output transistor against the overvoltage that may be applied to the power supply line, the counter electromotive voltage generated by the load, and against the reverse connection of the power supply. In short, the control circuit including the switch transistor 121, the switch transistor 114, and the resistor 118 is capable of: (1) forming an electrical path between the power supply line 103 and the control terminal of the output transistor 109 to make the output transistor 109 conductive, when the power supply is reversely connected; and (2) causing the electrical path to remain disconnected when the power supply is normally connected, even if the negative surge voltage is applied to the output terminal 106. The control circuit ensures a desired circuit operation when the power supply is normally connected. Note that the switch transistor 114 may be replaced with a diode having an anode connected on the side of the resistor 118.

Further, when the power supply is reversely connected, the reference voltage node 130 is preferably set at the potential substantially equal to that of the power supply line 101 so that the switch transistor 110 is reliably rendered non-conductive. To ensure the non-conductivity of the switch transistor 110, the bias output node 123 shown in FIG. 4 may be connected to the reference voltage node 130.

Figure 6:
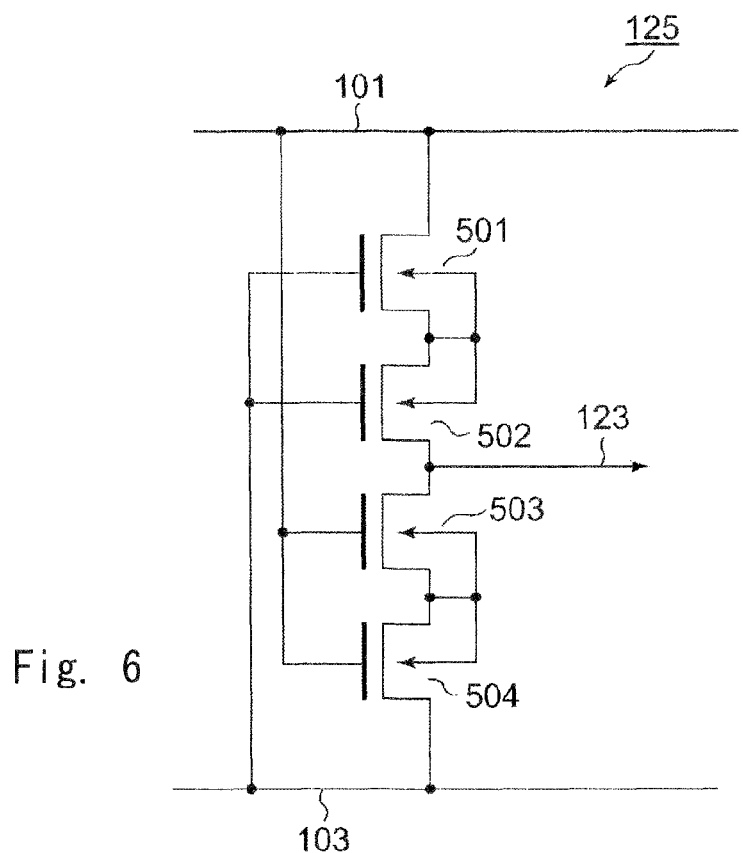
FIG. 6 is a circuit diagram showing an example of a bias voltage control circuit shown in FIG. 4.

FIG. 6 shows another exemplary embodiment of the bias voltage control circuit 125 shown in FIG. 4.

The bias voltage control circuit 125 includes four N-channel MOS transistors 501 to 504. Those transistors are connected to one other as shown in FIG. 6.

In this structure, when the power supply is normally connected (when +VB potential is supplied to the power supply line 101 and the ground potential is supplied to the power supply line 103), both the transistors 501 and 502 are rendered non-conductive, and both the transistors 503 and 504 are rendered conductive. Then, the ground potential is output to the bias output node 123.

When the power supply is reversely connected (when −VB potential is supplied to the power supply line 101 and the ground potential is supplied to the power supply line 103), both the transistors 501 and 502 are rendered conductive, and both the transistors 503 and 504 are rendered non-conductive. Then, the −VB potential is output to the bias output node 123.

Figure 7:
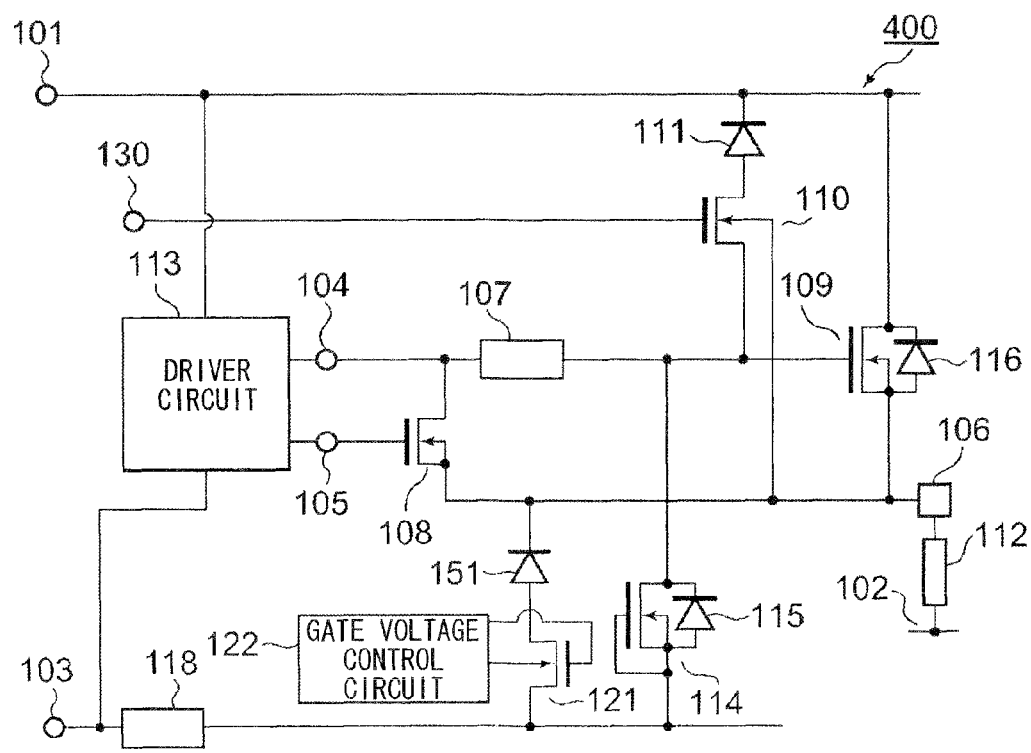
FIG. 7 is a circuit diagram showing a power supply control circuit according to a second exemplary embodiment of the present invention.

A still another exemplary embodiment of the present invention is shown in FIG. 7. Components identical with those shown in FIG. 3 are denoted by the same reference numerals, and a description thereof is omitted.

A power supply control circuit 400 according to an exemplary embodiment of the present invention is different from the power supply control circuit shown in FIG. 3 in that a diode 151 is additionally provided between the switch transistor 121 and the output terminal 106. The diode 151 has a function to enable the switch transistor 121 to be reliably rendered non-conductive in a power supply reverse connection mode.

In this structure, when the power supply is reversely connected, that is, when the −VB potential is supplied to the power supply line 101 and the ground potential is supplied to the power supply line 103, the −VB potential is output to the reference voltage node 130. Meanwhile, an electrical path is formed between the gate of the output transistor 109 and the power supply line 103 through the resistor 118 and the parasitic diode 115, thereby rendering the output transistor 109 conductive. As a result, the potential of the output terminal 106 is lowered to that of the power supply line 101, thereby a potential (effectively, voltage increased by an amount corresponding to a forward voltage drop of the diode 151 from the potential of the output terminal 106) of about (−VB+0.7 V) is output to an anode of the diode 151. Furthermore, a potential (effectively, voltage increased by an amount corresponding to a source potential of the transistor 131 from the potential of the output terminal 106) of about (−VB+0.7 V) is supplied to the control terminal of the switch transistor 121, and a potential of the bias output node 123 of about (−VB+0.7 V) is supplied to the substrate terminal of the switch transistor 121. Consequently, the switch transistor 121 is reliably rendered non-conductive.

As described above, in the power supply control circuit according to an exemplary embodiment of the present invention, a section for implementing the overvoltage protection function is prevented from causing a malfunction due to the power supply reverse connection protection circuit, even if the counter electromotive voltage (negative voltage surge) is generated when the output transistor 109 is turned off. Further, when the power supply is reversely connected, a section for implementing the power supply reverse connection protection function is capable of performing a desired operation.

Note that the present invention is not limited to the above-mentioned exemplary embodiments. In particular, the number and the like of the transistors and diodes can be properly changed depending on a required circuit constant.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A power supply control circuit, comprising:
   first and second power supply lines configured to have a power supply voltage applied therebetween;
   an output transistor provided between the first power supply line and an output terminal;
   a first switch transistor rendered conductive when a counter electromotive voltage is applied to the output terminal from a load coupled to the output terminal, to form a first electrical path between the first power supply line and a control terminal of the output transistor; and
   a control circuit that controls the output transistor to be rendered conductive by forming a second electrical path between the second power supply line and the control terminal of the output transistor when the power supply voltage is applied in a reverse direction between the first and second power supply lines, and that controls the second electrical path to be electrically disconnected when the power supply voltage is applied in a forward direction between the first and second power supply lines.

2. The power supply control circuit according to claim 1, wherein the control circuit comprises:
   a switching element provided between the control terminal of the output transistor and the second power supply line to form the second electrical path; and
   a second switch transistor provided between the output terminal and the second power supply line to cause the second electrical path to be electrically disconnected.

3. The power supply control circuit according to claim 2, wherein the control circuit further comprises a gate voltage control circuit that applies a potential corresponding to a direction of the power supply voltage applied between the first and second voltage lines, to each of a control terminal and a substrate terminal of the second switch transistor.

4. The power supply control circuit according to claim 3, wherein:
   the gate voltage control circuit applies a potential corresponding to a potential of the second power supply line, to each of the control terminal and the substrate terminal of the second switch transistor when the power supply voltage is applied in the forward direction between the first and second voltage lines; and
   the gate voltage control circuit applies a potential corresponding to a potential of the first power supply line, to a control terminal of the second switch transistor, and applies a potential corresponding to a potential at the output terminal, to the substrate terminal of the second switch transistor, when the power supply voltage is applied in the reverse direction between the first and second voltage lines.

5. The power supply control circuit according to claim 4, wherein the gate voltage control circuit comprises:
   first and second transistors each including a control terminal coupled to the control terminal of the second switch transistor, the first and second transistors being connected in series between the output terminal and the substrate terminal of the second switch transistor; and
   third and fourth transistors each including a control terminal coupled to the output terminal, the third and fourth transistors being connected in series between the substrate terminal of the second switch transistor and the control terminal of the second switch transistor.

6. The power supply control circuit according to claim 5, wherein the bias voltage control circuit comprises:
   a diode coupled between the first power supply line and the control terminal of the second switch transistor; and
   a resistor coupled between the control terminal of the second switch transistor and the second power supply line.

7. The power supply control circuit according to claim 4, wherein the gate voltage control circuit comprises:
   fifth and sixth transistors each including a control terminal coupled to the second power supply line, the fifth and sixth transistors being coupled between the first power supply line and the control terminal of the second switch transistor; and
   seventh and eighth transistors each including a control terminal coupled to the first power supply line, the seventh and eighth transistors being coupled between the control terminal of the second switch transistor and the second power supply line.

8. A power supply control circuit, comprising:
   an output transistor coupled between a first power supply line and an output terminal;
   a load coupled between the output terminal and a third power supply line;
   a gate charge discharging switch coupled between a control terminal of the output transistor and the output terminal;
   an overvoltage protection circuit, comprising
      a dynamic clamp circuit that limits a voltage difference between the first power supply line and the output terminal to a predetermined voltage value, and
      a first switch coupled between the dynamic clamp circuit and the control terminal of the output transistor, the first switch configured to be conductive or non-conductive based on a result of comparison between a reference voltage and a voltage at the output terminal;
   a power supply reverse connection protection circuit configured to supply an electric charge to the control terminal of the output transistor when a power supply is reversely connected;
   a second switch with one end coupled to the output terminal, and another end coupled to a second power supply line through a resistor; and
   a control circuit configured to supply a potential corresponding to a potential of one of the first power supply line and the second power supply line to a control terminal of the second switch according to a connection state of the power supply, and further configured to apply a potential, corresponding to a potential of one of the output terminal and the second power supply line, to a substrate terminal of the second switch according to the connection state of the power supply and a state of the output terminal.

9. The power supply control circuit according to claim 8, further comprising:
   a diode coupled between the second switch and the output terminal.

10. The power supply control circuit according to claim 8, wherein the control circuit comprises:
    a diode coupled between the first power supply line and the control terminal of the second switch; and a resistor coupled between the control terminal of the second switch and the second power supply line.

11. The power supply control circuit according to claim 9, wherein the control circuit comprises:
   a diode coupled between the first power supply line and the control terminal of the second switch; and
   a resistor coupled between the control terminal of the second switch and the second power supply line.

12. The power supply control circuit according to claim 8, wherein the control circuit comprises:
   first and second transistors each including a control terminal coupled to the control terminal of the second switch, the first and second transistors being connected in series between the output terminal and the substrate terminal of the second switch; and
   third and fourth transistors each including a control terminal coupled to the output terminal, the third and fourth transistors being connected in series between the substrate terminal of the second switch and the control terminal of the second switch.

13. The power supply control circuit according to claim 9, wherein the control circuit comprises:
   first and second transistors each including a control terminal coupled to the control terminal of the second switch, the first and second transistors being connected in series between the output terminal and the substrate terminal of the second switch; and
   third and fourth transistors each including a control terminal coupled to the output terminal, the third and fourth transistors being connected in series between the substrate terminal of the second switch and the control terminal of the second switch.

14. The power supply control circuit according to claim 8, wherein the power supply reverse connection protection circuit comprises:
   a transistor provided between the control terminal of the output transistor and a node located between the second switch and the resistor.

15. The power supply control circuit according to claim 8, wherein the control circuit comprises:
   fifth and sixth transistors each including a control terminal coupled to the second power supply line, the fifth and sixth transistors being connected in series between the first power supply line and the control terminal of the second switch; and
   seventh and eighth transistors each including a control terminal coupled to the first power supply line, the seventh and eighth transistors being connected in series between the control terminal of the second switch and the second power supply line.

16. A power supply control circuit, comprising:
   first and second power supply lines configured to have a power supply voltage applied therebetween;
   an output transistor connected between the first power supply line and an output terminal;
   a first switch provided between the first power supply line and a control terminal of the output transistor, the first switch rendered conductive when a counter electromotive voltage is applied to the output terminal from a load connected to the output terminal; and
   a control circuit that controls the output transistor to be rendered conductive by electrically connecting the control terminal of the output transistor and the second power supply line, or causes the control terminal of the output transistor and the second power supply line to be electrically disconnected from each other, according to a state of the power supply voltage applied between the first power supply line and the second power supply line.

17. The power supply control circuit according to claim 16, wherein:
   the control circuit controls the output transistor to be rendered conductive by electrically connecting the second power supply line and the control terminal of the output transistor, when the power supply voltage is applied in a reverse direction between the first power supply line and the second power supply line; and
   the control circuit causes the second power supply line and the control terminal of the output transistor to be electrically disconnected from each other, when the power supply voltage is applied in a forward direction between the first power supply line and the second power supply line.

18. The power supply control circuit according to claim 16, wherein the control circuit comprises:
   a switching element that causes the control terminal of the output transistor and the second power supply line to be electrically connected to each other;
   a second switch that causes the output terminal and the second power supply line to be electrically disconnected from each other; and
   a gate voltage control circuit that applies a potential corresponding to the state of the power supply voltage applied between the first power supply line and the second power supply line, to control and substrate terminals of the second switch.

19. The power supply control circuit according to claim 17, wherein the control circuit comprises:
   a switching element that causes the control terminal of the output transistor and the second power supply line to be electrically connected to each other;
   a second switch that causes the output terminal and the second power supply line to be electrically disconnected from each other; and
   a gate voltage control circuit that applies a potential corresponding to the state of the power supply voltage applied between the first power supply line and the second power supply line, to control and substrate terminals of the second switch.

20. The power supply control circuit according to claim 16, further comprising:
   a drive circuit connected between the first power supply line and the second power supply line to output a control signal to the control terminal of the output transistor.

21. The power supply control circuit according to claim 1, wherein the first switch transistor is rendered non-conductive when the power supply voltage is applied in a reverse direction between the first and second power supply lines.

22. The power supply control circuit according to claim 16, wherein the first switch transistor is rendered non-conductive when the power supply voltage is applied in a reverse direction between the first and second power supply lines.

* * * * *